United States Patent [19]

Monoi

[11] Patent Number: 5,532,503

[45] Date of Patent: Jul. 2, 1996

[54] CHARGE TRANSFER DEVICE WITH MULTI-LINE READ STRUCTURE

[75] Inventor: Makoto Monoi, Tokyo-To, Japan

[73] Assignee: Kabushiki Kaisha Toshiba, Kanagawa-ken, Japan

[21] Appl. No.: 449,341

[22] Filed: May 24, 1995

Related U.S. Application Data

[63] Continuation of Ser. No. 118,857, Sep. 10, 1993, abandoned.

[30] Foreign Application Priority Data

Sep. 11, 1992 [JP] Japan .................................. 4-243422

[51] Int. Cl.⁶ ........................ H01L 27/148; H01L 29/768
[52] U.S. Cl. ........................ 257/233; 257/234; 257/240; 257/241; 257/249; 257/250
[58] Field of Search .................................... 257/233, 234, 257/240, 241, 249, 250

[56] References Cited

U.S. PATENT DOCUMENTS

| | | | |
|---|---|---|---|
| 4,493,060 | 1/1985 | Varshney | 257/241 |
| 4,750,042 | 6/1988 | Murayama et al. | |
| 4,807,037 | 2/1989 | Iesaka et al. | 257/241 |
| 4,949,183 | 8/1990 | Stevens | 257/241 |
| 5,189,498 | 2/1993 | Sakakibara | 257/241 |

FOREIGN PATENT DOCUMENTS

| | | |
|---|---|---|
| 093411 | 11/1983 | European Pat. Off. . |
| 495523 | 7/1992 | European Pat. Off. . |
| 62-4359 | 1/1987 | Japan ............... 257/241 |

OTHER PUBLICATIONS

Patent Abstracts of Japan, vol. 15, No. 412 (E–1124) Oct. 21, 1991.

*Primary Examiner*—Ngân V. Ngô
*Attorney, Agent, or Firm*—Finnegan, Henderson, Farabow, Garrett & Dunner

[57] ABSTRACT

A charge transfer device of two-line read structure is formed with a first charge transfer path for transferring first-group charges, a second charge transfer path for transferring second-group charges, and a transfer gate portion (106). To complete the transfer operation of all the second-group charges outputted at a time, the transfer operation of the charges from the first transfer path to the second charge transfer path by the transfer gate portion is divided into a plurality of times. In addition, the second-group charges outputted at time are transferred for each divided set of pixels in each divided transfer operation.

5 Claims, 11 Drawing Sheets

CHARGE TRANSFER DEVICE WITH MULTI-LINE READ STRUCTURE

This application is a continuation of application Ser. No. 08/118,857, filed Sept. 10, 1993, now abandoned.

BACKGROUND OF THE INVENTION

The present invention relates to a charge transfer device, and more particularly to a charge transfer device suitable for use for a charge transferring section of a high density solid-state image sensing device, for instance.

As a charge transfer device (CTD), there exists a charge coupled device (CCD) for transferring charges generated at pixels by controlling potentials generated in a semiconductor substrate.

Figure 1:
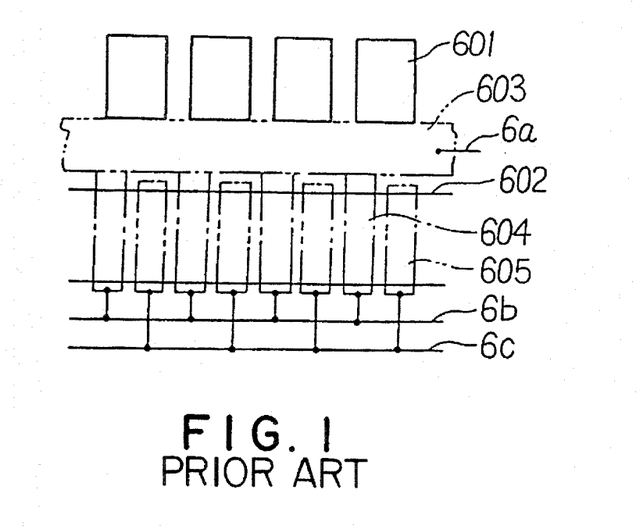
FIG. 1 is a plan view showing a conventional one-line read charge transfer device.

FIG. 1 shows a most typical CCD of single-line read structure. In FIG. 1, pixels 601, a buried channel region 602 as the CCD register, a shift gate electrode 603 and two register transfer electrodes 604 and 605 are formed in a substrate. A great number of pixels 601 are formed one by one in a line at regular intervals, and each pixel 601 generates and accumulates a signal charge according to the intensity of incident light. The shift gate electrode 603 controls the charge transfer from the pixels 601 to the buried channel region 602. The register transfer electrodes 604 and 605 control the charge transfer on and along the buried channel region 602.

A drive pulse signal 6a is applied to the shift electrode 603; a drive pulse signal 6b is applied to the transfer electrode 604; and a drive pulse signal 6c is applied to the transfer electrode 605, respectively.

In operation, when a shift gate channel region under the shift gate electrode 603 in the substrate is turned on in response to the drive pulse signal 6a, the accumulated charges of the respective pixels 601 flow through the turned-on shift gate channel region into potential wells formed in the buried channel region 602 and under the two register transfer electrodes 604 and 605. Thereafter, the charges in the wells are transferred in sequence to an output circuit (not shown) when the drive pulse signals 6b and 6c are turned on or off alternately and reciprocally.

In the technical field of the above-mentioned CTD, the pixels are recently microminiaturized more and more into a higher density in the same way as with the case of other semiconductor devices. Therefore, when the pitch of the pixels is decreased in the CCD for higher density, the pitch of the potential wells (formed in the buried channel region 602 so as to function as register sections) arranged for the respective pixels and the register transfer electrodes 604 and 605 are also inevitably decreased, thus restricting the further microminiaturization of the CCD.

To overcome this problem, a CCD of multi-line read structure has been so far proposed such that the charge transfer from a great number of pixels to the buried channel region (potential wells) is divided or shared by a plurality of transfer register lines.

Figure 2:
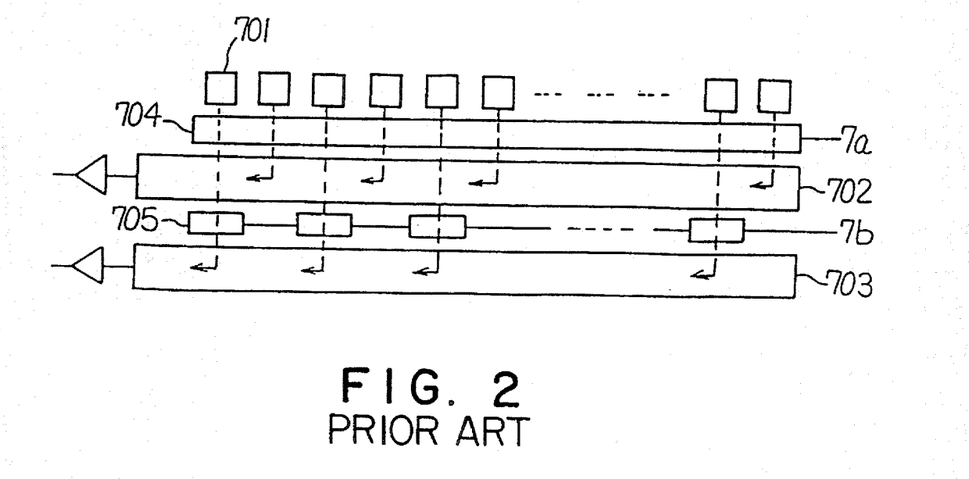
FIG. 2 is a plan view showing a conventional two-line read charge transfer device.

FIG. 2 shows a charge transfer device of two-line read structure, as the basic device of the multi-line read CCD. In FIG. 2, there are formed pixels 701, two buried channel regions 702 and 703 of the CCD register (referred to as a first RC (register channel) region 702 and a second RC region 703, respectively), a shift gate electrode 704, a transfer gate electrode 705 for controlling the charge transfer from the first RC region 702 to the second RC region 703 in a substrate. The transfer gate electrode 705 is arranged so as to face the alternate pixels.

Charges of a number of pixels 701 are once transferred to the first external RC region 702 by the shift gate electrode 704, and then the charges of the alternate pixels 701 are further transferred to the second RC region 703 by the transfer gate electrode 705. Thereafter, the charges in the first and second RC regions 702 and 703 are transferred to an output circuit (not shown), respectively.

Figure 3:
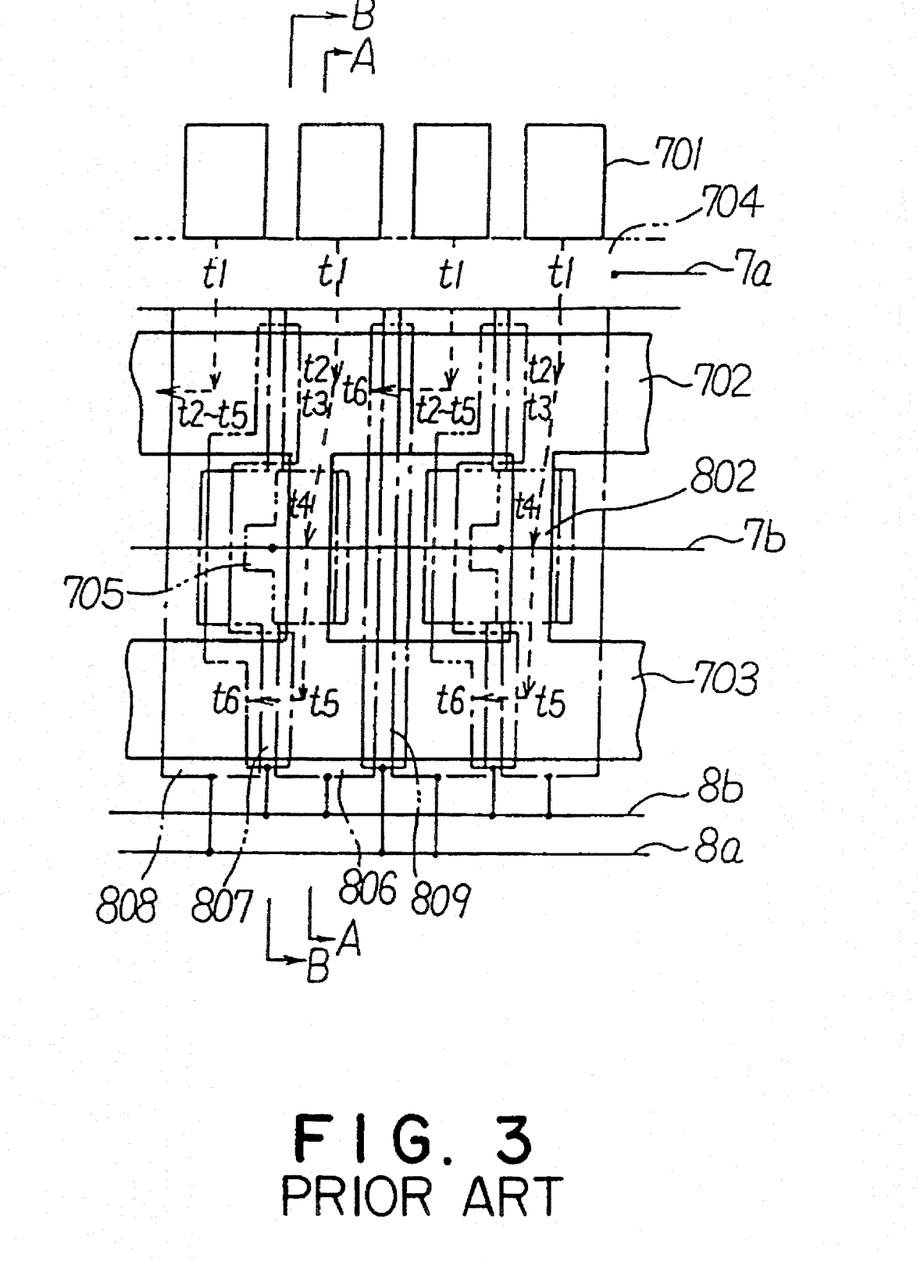
FIG. 3 is an enlarged plan view showing the essential portion from the pixels to the register portions of the two-line read charge transfer device (shown in FIG. 2) of two-layer poly silicon electrode structure.
Figure 4A:
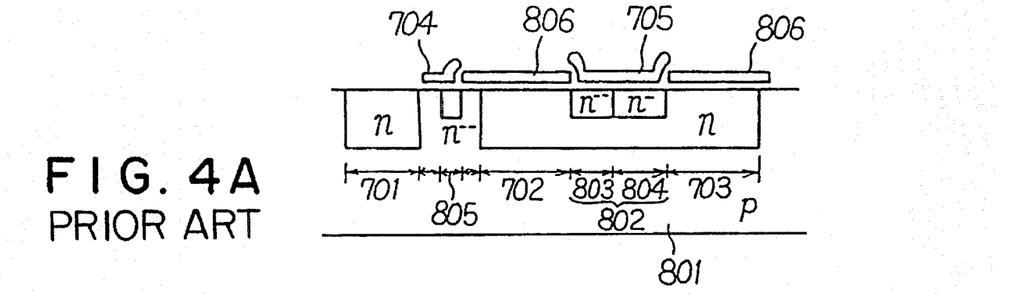
FIGS. 4A and 4B are cross-sectional views showing the same conventional charge transfer device shown in FIG. 3, taken along the lines A—A and B—B, respectively.
Figure 4B:
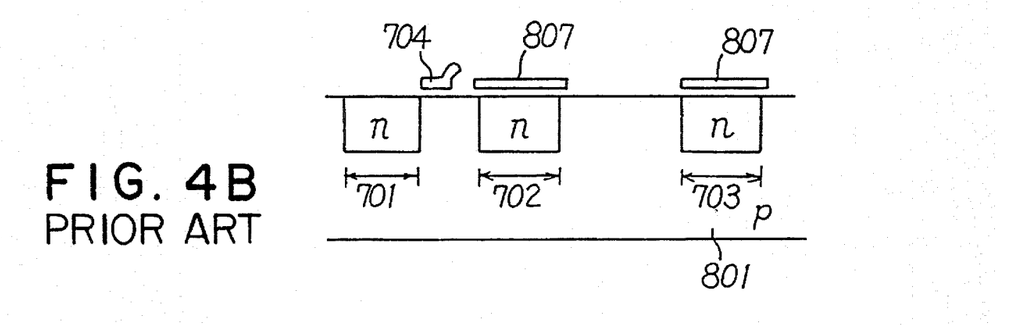

FIG. 3 and FIGS. 4A and 4B are enlarged views showing the structure of the charge transfer device shown in FIG. 2, in which a two-layer poly silicon electrode structure is shown by use of the same reference numerals as with the case of the charge transfer device shown in FIG. 2.

In these drawings, a plurality of n-type pixels 701 and n-type first and second RC regions 702 and 703 are formed in a p-type substrate 801. Under transfer gate electrode 705, a transfer gate burying channel region 802 (referred to as TC region, hereinafter) is formed. The TC region 802 is composed of an n-type region 803 and n-type region 804, adjacent to each other. The n-type region 803 is adjacent to the first RC region 702. Further, under a shift gate region 704, an n-type shift gate channel region 805 (referred to as GC region, hereinafter) is formed.

Figure 5A:
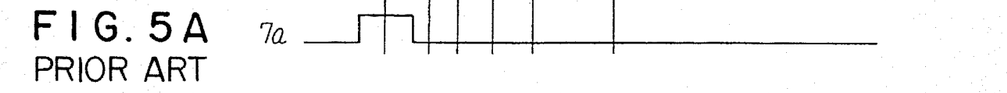
FIGS. 5A to 5D are timing charges of drive pulse signals applied to the electrodes of the charge transfer device shown in FIG. 3.
Figure 5B:
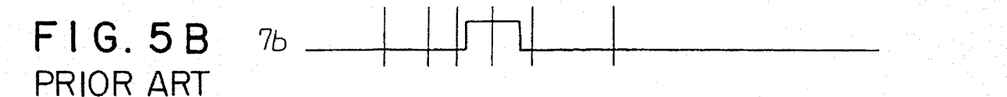
Figure 5C:
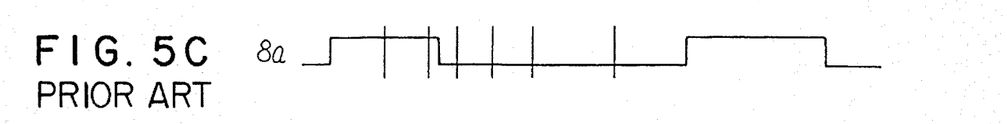
Figure 5D:
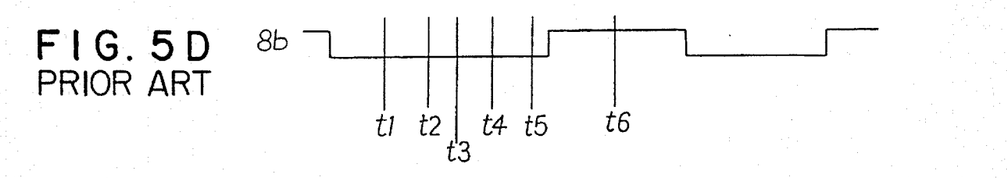

Transfer control electrodes 806 to 809 are arranged on the first and second RC regions 702 and 703. A drive signal 8a as shown in FIG. 5C is applied to the transfer control electrodes 806 and 809, and a drive signal 8b as shown in FIG. 5D is applied to the transfer control electrodes 807 and 808. The charges on the first and second RC regions 702 and 703 are transferred to an output circuit by inverting the drive signals 8a and 8b alternately and reciprocally.

FIGS. 5A to 5D show a timing charge of these drive pulse signals 7a, 7b, 8a and 8b, respectively. Further, FIGS. 6A and 6B show two potential distributions at the cross sections as shown in FIG. 3.

The operation of the device as shown in FIG. 2 will be described hereinbelow with reference to these drawings. Further, the charges of the pixels 701 transferred from the first RC region 702 to the output circuit are referred to as charges e1, and the charges of the pixels 701 transferred from the second RC region 703 to the output circuit are referred to as charges e2, respectively.

Figure 6A:
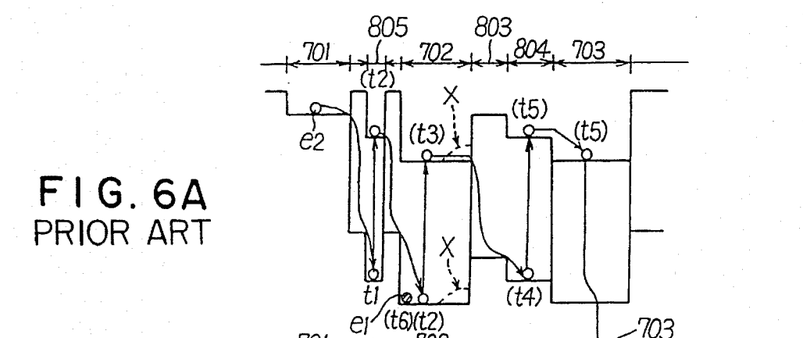
FIGS. 6A and 6B are potential distribution diagrams at the cross sections shown in FIGS. 4A and 4B, respectively.
Figure 6B:
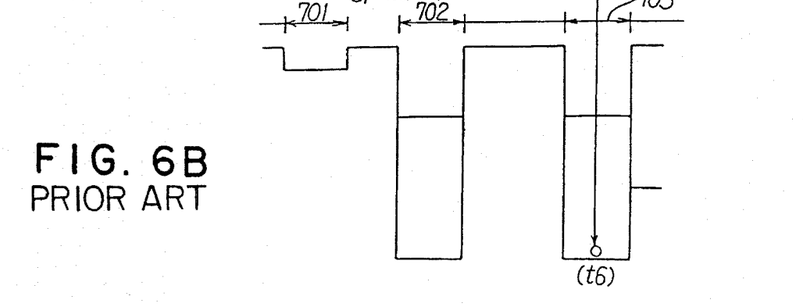

With reference to FIGS. 3, 6A and 6B, at time point t1, the drive pulse signals 7a and 8a are both at an "H" level and the drive pulse signals 7b and 8b are both at a "L" level. Accordingly, the charges e1 and e2 of the pixels 701 are in the wells under the shift gate electrodes 704. Under these conditions, at time point t2, when the drive signal 7a changes to the "L" level, the charges e1 and e2 under the shift gate electrode 704 are transferred to the first RC region 702. Further, at time point t3, since the drive signal 8a is also changed to the "L" level, the charges e1 and e2 transferred to the first RC region 702 stand by thereat. From this time point, the transfer of only the charges e2 starts from the first RC (register channel) region 702 to the second RC (register channel) region 703.

First, at time point t4, since only the drive pulse signal 7b is at the "H" level, the TC (transfer channel) region 802 is turned on, so that the charges e2 in the first RC region 702 are transferred to the TC region 802. Next, at time point t5, since all the drive pulse signals are changed to the "L" level, the TC region 802 is turned off, so that the charges e2 in the TC region 802 are transferred to the second RC region 703 lower in potential than the TC region 802, thus completing the transfer of the charges e2 between the two RC regions 702 and 703.

Further, the charges e1 are kept remaining in the first RC region 702 between the time points t2 to t5. At the time point t6, since the drive pulse signal 8a changes to the "L" level and the drive pulse signal 8b changes to the "H" level, the charges e1 and e2 are all transferred from the regions under the electrodes 806 to the regions under the electrodes 807 and 808 in the first and second RC regions 702 and 703, respectively. Thereafter, whenever the drive pulse signals 8a and 8b are inverted alternately and reciprocally, the charges e1 and e2 are transferred to the output circuit on the first and second RC regions 702 and 703.

Figure 7:
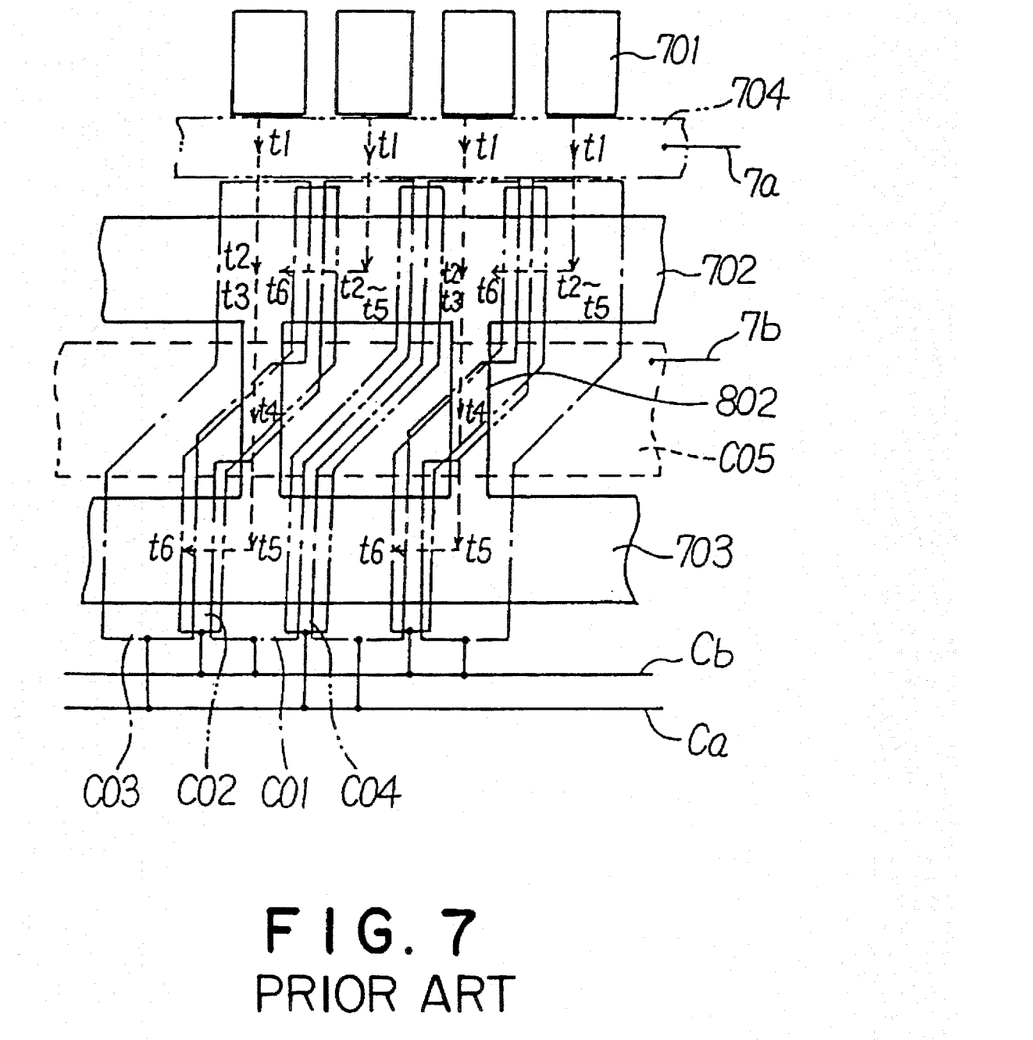
FIG. 7 is an enlarged plan view showing the essential portion from the pixels to the register portions of the two-line read charge transfer device (shown in FIG. 2) of three-layer poly silicon electrode structure.

Further, FIG. 7 shows a conventional charge transfer device of two-line read and three-layer poly silicon electrodes structure, in which a first layer electrode is denoted by dot-dashed lines, a second layer electrode is denoted by dot-dot-dashed lines, and a third layer electrode is denoted by dashed lines, respectively.

In FIG. 7, electrodes C01 to C04 for constituting a CCD register portion, and an electrode C05 for constituting a transfer gate portion are all formed in a substrate. The electrode C01 and C03 are arranged on the first layer, the electrodes C02 and C04 are arranged on the second layer, and the electrode C05 is arranged on the third layer, respectively.

Further, in FIG. 7, a drive pulse signal Ca is applied to the electrodes C03 and C04 and a drive pulse signal Cb is applied to the electrodes C01 and C02, respectively to control the charges on the first and second RC regions 702 and 703.

In comparison between the devices shown in FIG. 3 and FIG. 7, a difference between the two is as follows: in the case of the charge transfer device shown in FIG. 3, the shapes of the electrodes 806 to 809 are such that both ends of the electrodes 806 to 809 are located on the same longitudinal position of the first and second RC regions 702 and 703, respectively. In other words, the charges on the first and second RC regions 702 and 703 are arranged at the same positions in the longitudinal transfer direction of the RC regions.

In contrast with this, in the case of the charge transfer device shown in FIG. 7, the shapes of the electrodes C01 to C04 are such that one portions of the electrodes C01 to C04 located on the first RC region 702 are offset by one pitch of the pixel 701 from other portionss of the same electrodes C01 to C04 located on the second RC region 703. Therefore, the charges on the second RC region 703 are transferred being advanced by one pitch of the pixel 701 with respect to the charges on the first RC region 702 in synchronism with one another. Accordingly, the drive pulse signal Ca shown in FIG. 7 corresponds to the drive pulse signal 8b shown in FIG. 5D, and the drive pulse signal Cb shown in FIG. 7 corresponds to the drive pulse signal 8a shown in FIG. 5C, respectively.

The charge transfer device shown in FIG. 7 operates in quite the same way as with the case of the charge transfer device shown in FIG. 3, although the shapes of the electrodes are different between both.

In the conventional charge transfer device of two-line read structure as described above, it is possible to double the pitch of the register portion as compared with the conventional device of single-line read structure. Further, in the case of the device of structure of three or more lines, it is possible to increase the pitch of the register portion three times or more according to the number of lines. Accordingly, the charge transfer device of multi-line read structure is effective, when the high density charge transfer device in which the pitch of the pixels is small is required to be manufactured.

In the above-mentioned conventional charge transfer device of multi-line structure, however, the TC region 802 for transferring charges between registers 702 and 703 must be formed additionally. In this case, since the width of TC region 802 tends to be limited and thereby narrowed due to the layout of other portions (e.g., electrode wiring and channel separating regions must be formed), there exists a problem in that potential barriers X (see FIG. 6A) are produced at the outlet portions of the first RC region 702 on the side of the TC region 802 and thereby transfer of the charges e2 is obstructed by the presence of the potential barriers X, thus causing the charges to be not transferred and thereby to remain.

In addition, although being suitable for high density device, the multi-line structure raises another problem in that it is difficult to form the TC region 802 according to the pixel pitch from the layout standpoint.

SUMMARY OF THE INVENTION

With these problems in mind, therefore, the object of the present invention is to provide a charge transfer device which can reduce the limitation in the channel width of the transfer gate portion.

To achieve the above-mentioned object, the present invention provides a charge transfer device, comprising: a first charge transfer path for transferring charges of pixels of a first group; a second charge transfer path arranged in parallel to said first charge transfer path, for transferring charges of pixels of a second group interposed between the two pixels of the first group; a transfer gate portion for transferring charges of the second-group pixels from said first charge transfer path to said second charge transfer path; and transfer control electrodes for completing transfer operation of all the charges outputted at a time from the second-group pixels, by dividing the transfer operation of the charges outputted at a time from the second-group pixels through said transfer gate portion into a plurality of times and further by transferring charges outputted at a time from the second-group pixels for each divided set of pixels in each divided transfer operation.

The charge transfer device further comprises charge keeping means interposed between the pixels and said first charge transfer path, for keeping charges of the second-group pixels other than those being transferred among the charges to be transferred by said transfer gate portion.

Further, the transfer control electrodes comprises: shift gate electrode portions for transferring charges of the first and second groups from the pixels to said charge keeping means; second-group transfer control electrodes responsive to a first control signal, for transferring the second-group charges from said charge keeping means to said first charge transfer path; first-set transfer control electrodes responsive to a second control signal generated after the first control signal, for transferring first-set charges of a half of the pixels for generating the second-group charges, from said first charge transfer path to said second charge transfer path; second-set transfer control electrodes responsive to a third control signal generated after the second control signal, for transferring second-set charges of a remaining half of the pixels for generating the second-group charges, from said first charge transfer path to said second charge transfer path; and first-group transfer control electrodes responsive to a fourth control signal after the third control signal, for transferring the first-group charges from said charge keeping means to said first charge transfer path.

The transfer control electrodes are formed in multilayer (e.g., two or three) structure on a semiconductor substrate in which the pixels, said first charge transfer path, said second charge transfer path, and said transfer gate portion are formed.

In the charge transfer device according to the present invention, since the transfer operation of all the second-group charges to be transferred between the two transfer paths by the transfer gate portion is divided into a plurality of times, it is possible to reduce the number of transfer gates by the number of divisions, thus relaxing the restriction on the channel width of the transfer gate portion. Consequently, it is possible to eliminate the potential barrier due to the narrow channel effect, thus preventing charges from being kept remaining during the charge transfer operation between the first and second transfer paths.

Further, since the charge keeping portion is formed, it is possible to prevent the charges of two adjacent pixels from being mixed with one another, by keeping some charges at the charge keeping portion when the other remaining charges are being transferred from the first transfer path to the second transfer path.

Therefore, it is possible to freely determine the number of charge transfer operations of the transfer gate portion.

In this case, when two sets of the charges are transferred at a time from the charge keeping portion to the first charge transfer path, while keeping another set of remaining charges at the charge keeping portion, it is possible to prevent the charges of different pixels from being mixed with one another on the first charge transfer path without respect to the number of charge transfer operations of the transfer gate portion.

In other words, it is possible to obtain a sufficient margin with respect to the layout of the transfer gate portion, thus realizing a CCD of higher density pixels and higher reliability.

DETAILED DESCRIPTION OF THE PREFERRED EMBODIMENTS

The embodiments of the charge transfer device according to the present invention will be described hereinbelow with reference to the attached drawings.

Figure 8:
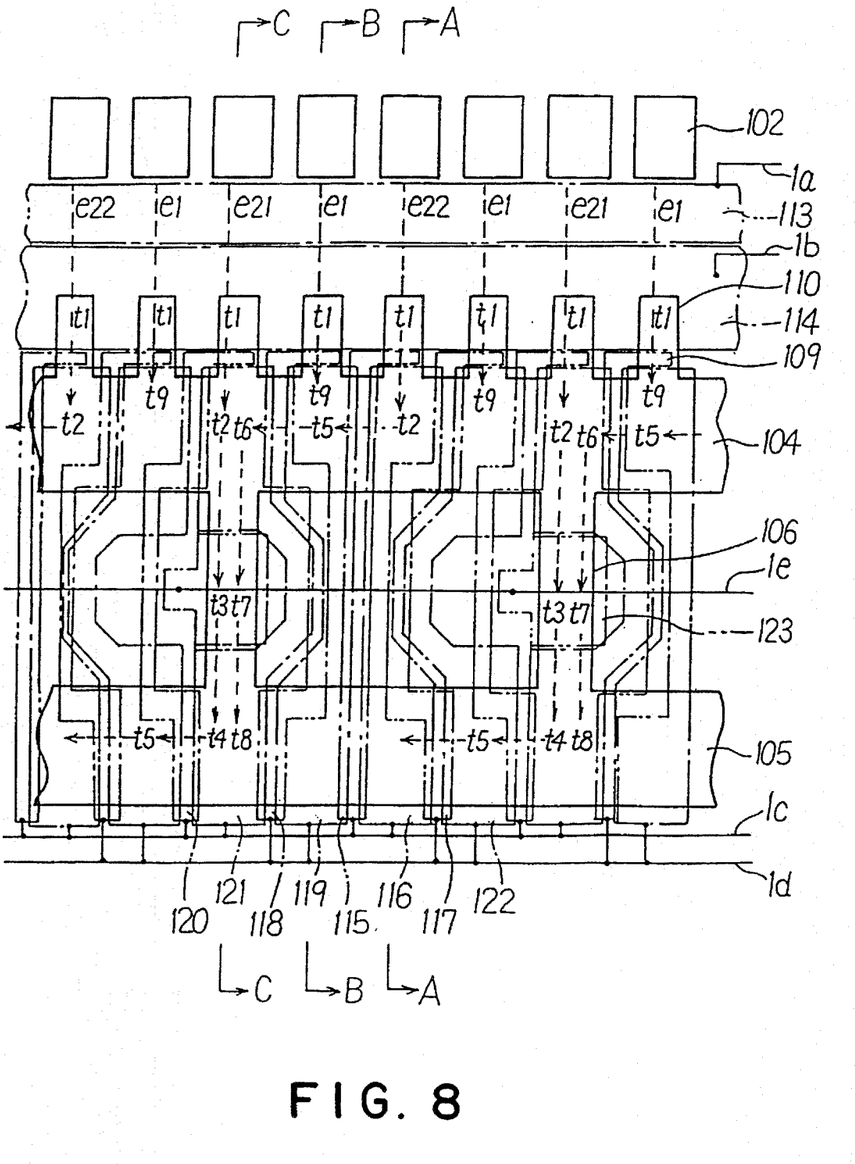
FIG. 8 is a plan view showing a first embodiment of the charge transfer device according to the present invention.
Figure 9A:
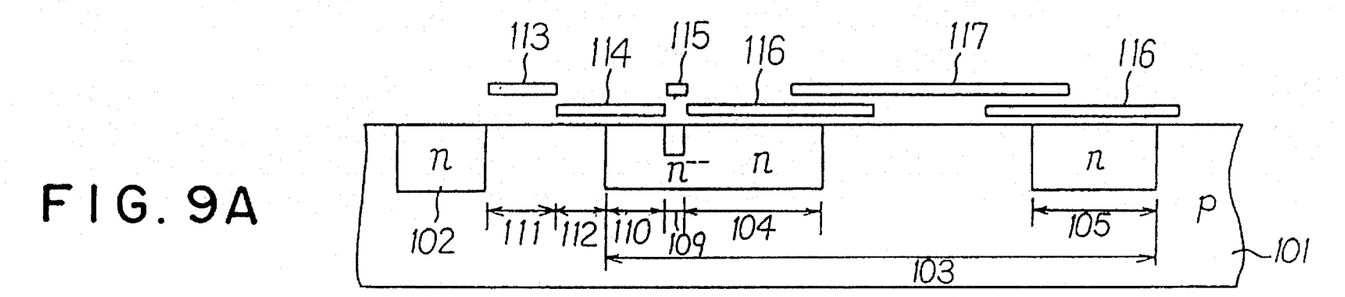
FIGS. 9A to 9C are cross-sectional views showing the same charge transfer device shown in FIG. 8, taken along the lines A—A, B—B, and C—C, respectively.
Figure 9B:
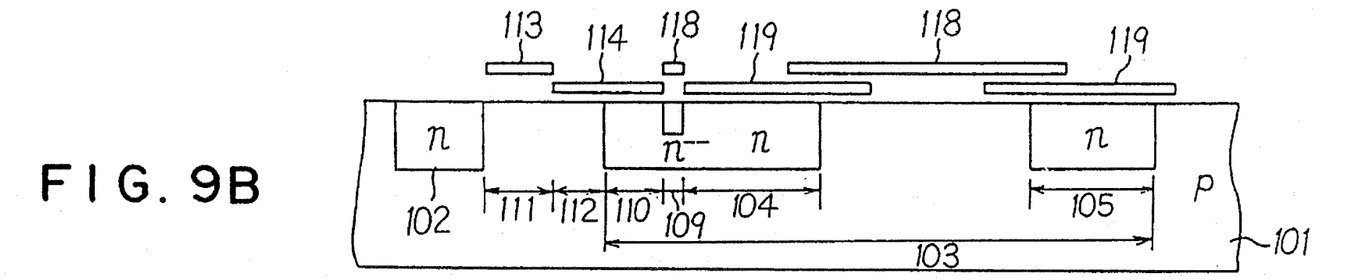
Figure 9C:
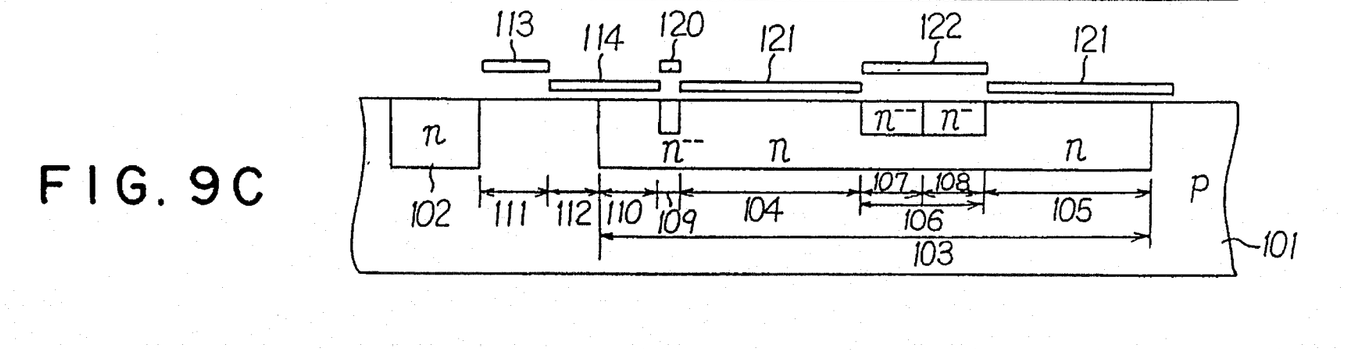

FIGS. 8 and 9A to 9C show the first embodiment of the present invention, in which the device of two-line read and two-layer poly silicon electrode structure is shown. Further, in FIG. 8, the substrate buried regions are denoted by solid lines; the first layer electrodes are denoted by dot-dashed lines, and the second layer electrodes are denoted by dot-dot-dashed lines. Further, FIG. 9A is a cross-sectional view taken along the line A—A in FIG. 8; FIG. 9B is a cross-sectional view taken along the line A—A in FIG. 8; and FIG. 9C is a cross-sectional view taken along the line C—C in FIG. 8.

Further, in these drawings, n-type pixels 102 and an n-type buried channel region 103 are formed in a p-type substrate 101. A great number of pixels 102 are arranged in a line. The pixels of a first group whose charges are transferred on and along a first charge transfer path (described later) and the pixels of a second group whose charges are transferred on and along a second charge transfer path (described later) are arranged alternately.

A buried channel region 103 is provided with a CCD register channel region (referred to as a first RC region) 104 used as a first charge transfer path and another CCD register channel region (referred to as a second RC region) 105 used as a second charge transfer path in such a way that both the register channel regions 104 and 105 are arranged in parallel to each other.

Channel regions (referred to as TC regions, hereinafter) 106 of the transfer gate portion are formed between the first and second RC regions 104 and 105 and in the buried channel region 103. Each of the TC regions 106 is provided in the proportion of one to two pixels of the second group. Each TC region 106 is composed of an n-type region 107 formed in the vicinity of the first RC region 104 and an n-type region 108 formed in the vicinity of the second RC region 105. Accumulation gate register regions (referred to as GR regions) 110 for constituting charge keeping portions are formed between the pixels 102 and the first RC region (first charge transfer path) 104 and in the buried channel region 103. Each of these GR regions 110 is formed for each pixel 102 so as to project from the first RC region 104. Further, an n-type charge keeping barrier portion 109 as a potential barrier is formed between the GR region 110 and the first RC region 104, respectively.

Further, two p-type shift gate channel regions (referred to as GC regions, hereinafter) 111 and 112 are formed between the pixels 102 and the GR regions 110 and in the substrate 101. The GC region 111 is formed in the vicinity of the pixels 102 and the GC region 112 is formed in the vicinity of the first RC region 104.

Further, an electrode 113 for constituting the shift gate portion is formed in the substrate 101 so as to extend on and along the GC region 111, in order to control the charge transfer from the pixels 102 to the GC region 111.

Further, an electrode 114 for constituting a charge keeping portion and electrodes 115 to 122 for constituting CCD register portions are formed on the substrate 101. The electrode 114 extends along the GR region 110 and has a width extending from over the GC region 112 to over the GR region 110. The electrode 114 controls the charge transfer from the GC region 111 to the GR region 110. The electrodes 115 to 121 are arranged over the first and second RC regions 104 and 105 to control the charge transfer operation on the RC regions 104 and 105.

The electrodes 115, 117, 118 and 120 are also arranged on the n-type charge keeping barrier portion 109. The electrodes 117 and 118 control the charge transfer of the first-group pixels 103 from the GR region 110 to the first RC region 104, and the electrodes 114 and 120 control the charge transfer of the second-group pixels 102 from the GR region 110 to the first RC region 104.

In addition, electrodes 123 for constituting the transfer gate portion are formed on the TC regions 106 and the substrate 101, in order to control the charge transfer from the first RC region 104 to the second RC region 105.

Further, as shown in FIG. 8, a shift gate drive pulse signal 1a is applied to the electrode 113; an accumulation gate drive pulse signal 1b is applied to the electrode 114; a CCD register drive pulse signal 1c is applied to the electrodes 115, 116, 120, and 121; a CCD register drive pulse signal 1d is applied to the electrodes 116 to 119; and a transfer gate drive pulse signal 1e is applied to the electrode 123, respectively. These signals 1a to 1e are applied by control means (not shown) to control the charge transfer operation by the transfer gate portion. In more detail, the transfer of all the charges outputted at a time from the second-group pixels can be completed as follows: the charge transfer operation by the transfer gate portion for the charges outputted at a time from the second-group pixels are divided into several times, and further the charges outputted at a time from the second-group by the above-mentioned respective charge transfer operation are transferred set by set divided in unit of pixel.

Figures 10A, 10B, 10C, 10D:
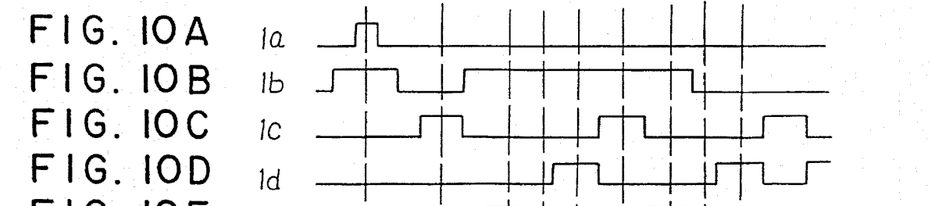
FIGS. 10A to 10E are timing charges of drive pulse signals applied to the electrodes of the first embodiment of the charge transfer device shown in FIG. 8.
Figure 10E:
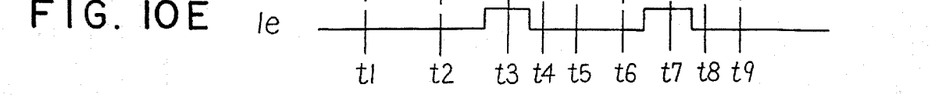
Figure 11A:
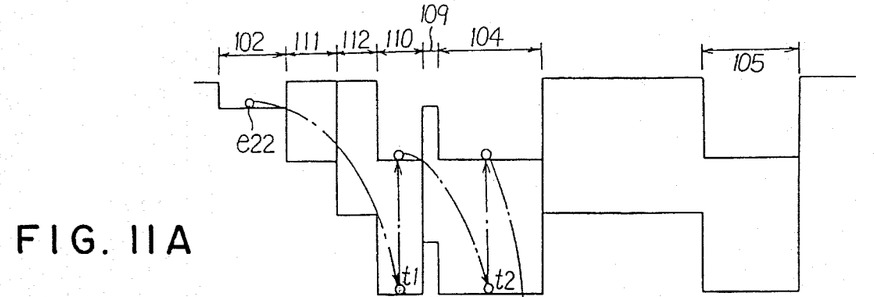
FIGS. 11A to 11C are potential distribution diagrams at the cross sections shown in FIGS. 9A to 9C, respectively.
Figure 11B:
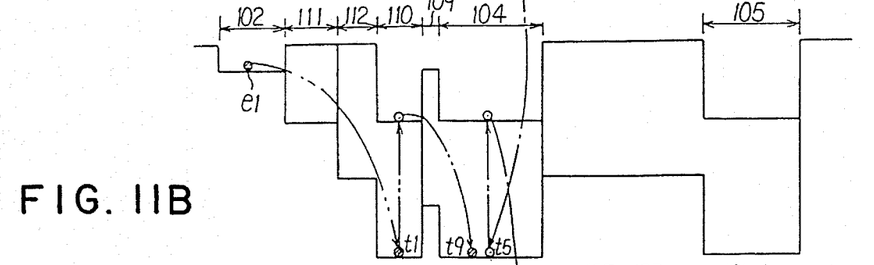
Figure 11C:
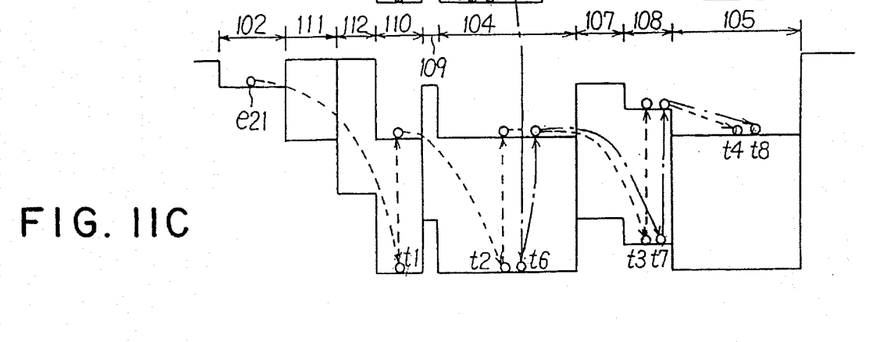

FIGS. 10A to 10E show the timing charts of these drive signals, and FIGS. 11A to 11C show the control operation on the basis of these drive signals.

The above-mentioned control operation based upon the drive signals will be described hereinbelow with reference to FIGS. 10A to 10E and FIGS. 11A to 11C. Further, the potential distribution diagrams shown in FIGS. 11A to 11C are obtained at the cross-sectional views shown in FIGS. 9A to 9C, respectively.

In the respective drawings, charges e1 are the first-group charges transferred on and along the first RC region 104 and charges e21 and e22 are the second-group charges transferred on and along the second RC region 105. Further, the charges e21 and e22 are transferred from the first RC region 104 to the second RC region 105 being divided into two times. Here, charges e21 are the second group charges (referred to as the second-group first-set charges) transferred to the second RC region 105 (the second charge transfer path) by the first transfer operation and transferred on and along the second RC region 105. The charges e22 are the second group charges (referred to as the second-group second-set charges) transferred to the second RC region 105 by the second transfer operation and transferred on and along the second RC region 105.

First, at time t1, the drive pulse signals 1a and 1b are both at an "H" level, and the drive pulse signals 1c and 1e are at an "L" level. Therefore, the GR (gate register) region 110 and the GC (shift gate channel) regions 111 and 112 are turned on, and the first RC (register channel) region 104 (first charge transfer path) and the charge keeping barrier portion 109 are turned off, so that all the charges of the pixels 102 are transferred to the GR region 110, respectively.

Next, at time t2, since only the drive pulse signal 1c changes to the "H" level, the region under the electrodes 115, 116, 120 and 121 and in the first RC region 104 and the n-type charge keeping barrier portion 109 are turned on, and the regions under the electrodes 117 and 119 are turned off. Accordingly, the second group charges e21 and e22 are transferred from the GR region 110 to the first RC region 104. On the other hand, the first group charges e1 are kept remaining in the GR region 110.

Thereafter, at time t3, since the drive pulse signals 1b and 1e change both to the "H" level and the drive pulse signals 1a, 1c and 1d are at the "L" level, the GR region 110 and the TC (transfer channel) regions 107 and 108 are turned on, and the first RC region 104 (all over) and the n-type charge keeping barrier portion 109 are turned off. Accordingly, the second-group first-set charges e21 are transferred from the first RC region 104 to the TC region 108. On the other hand, since the first RC region 104 is off all over, the second-group second-set charges e22 are kept remaining in the region under the electrode 116 and in the first RC region 104. Further, since the GR region 110 is in the turn-on status, the first group charges e1 still remain in the GR region 110.

At time t4, since only the drive pulse signal 1b is at the "H" level, only the GR region 110 is turned on. Accordingly, the TC region 108 and the second RC region 105 are turned off, so that the second-group first-set charges e21 are transferred from the TC region 108 to the second RC region 105, thus completing the transfer of the second-group first-set charges e21 by the transfer gate portion. For the same reason as at the time t3, the second-group second-set charges e22 remain in the region under the electrode 116 and in the first RC region 104. Further, the first-group charges e1 remain in the GR region 110.

Further, at time t5, the drive pulse signals 1b and 1d are at the "H" level and the other drive pulse signals 1a, 1c and 1e are at the "L" level. Therefore, the regions under the electrodes 117 to 119 and 122 and in the first and second RC regions 104 and 105 are turned on, and the regions under the electrodes 115, 116, 120 and 121 and in the first and second RC regions 104 and 105 are turned off. As a result, the second-group second-set charges e22 are transferred from the region under the electrodes 115 and 116 in the first RC region 104 to the region under the electrodes 118 and 119 in the same RC region 104. Further, the second-group first-set charges e21 are transferred from the region under the electrodes 120 and 121 in the second RC region 105 to the region under the electrodes 117 and 122. The first-group charges e1 remain in the GR region 110 for the same reason as above.

At time t6, since the drive pulse signals 1b and 1c are at the "H" level and the drive pulse signals 1a, 1d and 1e are at the "L" level, the region under the electrodes 115, 116, 120 and 121 and in the first RC region 104 are turned on, and the region under the electrodes 117 to 119 and 122 and in the same RC region 104 are turned off. Accordingly, the second-group second-set charges e22 are transferred from the region under the electrodes 118 and 119 and in the first RC region 104 to the region under the electrodes 120 and 121 and in the same RC region 104 so as to face the transfer gate portion. The second-group first-set charges e21 are also transferred from the region under the electrodes 117 and 122 and in the second RC region 105 to the region under the electrodes 115 and 116. The first-group charges e1 remain in the GR region 110 for the same reason as above.

At time t7, the drive pulse signals 1b and 1e are at the "H" level and the drive pulse signals 1a, 1c and 1d are at the "L" level, so that the TC regions 107 and 108 are turned on and the first and second RC regions 104 and 105 are turned off. Accordingly, the second-group second-set charges e22 are transferred from the region under the electrodes 120 and 121 and in the first RC region 104 to the TC region 108. Further, since the second RC region 105 are turned off all over, the second-group first-set charges e21 remain as they are, and the first-group charges e1 remain in the GR region 110 in the same way as above.

At time t8, all the drive pulse signals 1a to 1e change to the "L" level. Then, first since the TC regions 107 and 108 are turned off, the second-group second-set charges e22 are transferred to the region under the electrodes 120 and 121 in the second RC region 105 turned off in the same way, thus completing the transfer of the second-group second-set charges e22 by the transfer gate portion. At this time, since the second-group first-set charges e21 remain at the region under the electrodes 117 and 122 and in the second RC region 105 for the same reason as above, the charges e21 are not mixed with the charges e22. Under these conditions, all the second-group charges e21 and e22 have been transferred to the second RC region 105. The first-group charges e1 are kept remaining at the GR region 110, because the n-type charge keeping barrier portion 109 are turned off.

Further, at time t9, since only the drive pulse signal 1d is at the "H" level, the regions under the electrodes 117 to 119 and 122 and in the first and second RC regions 104 and 105 are turned on and the regions under the electrodes 115, 116, 120 and 121 are turned off. Further, since the GR region 110 is turned off, the first-group charges e1 are transferred from the GR region 110 to the region under the electrodes 117 to 119 and 122 and in the first RC region 104. Further, the second-group charges e21 and e22 are transferred from the region under the electrodes 115, 116, 120 and 121 and in the second RC region 105 to the region under the electrodes 117 to 119 and 122. Thereafter, the charges e1, e21 and e22 are transferred on and along the first and second RC regions 104 and 105 to an output circuit, by turning on and off the drive pulse signals 1c and 1d alternately and reciprocally.

As described above, in the first embodiment, since the transfer operation of the transfer gate portion for the second-group charges e21 and e22 is divided into two transfer steps, it is possible to reduce the number of the transfer gates in half as compared with the case of the conventional charge transfer device as shown in FIG. 2. In other words, it is possible to relax the restriction on the channel width of the outlet portion from the first RC region 104 to the TC region 106 of the transfer gate portion. Therefore, the potential barrier due to the narrow channel effect can be eliminated, thus preventing the charges from remaining during the charge transfer between the first and second RC (register channel) regions 104 and 105 or the first and second transfer paths.

Further, as well understood in comparison with the conventional charge transfer device as shown in FIG. 3, it is possible to obtain a space margin for element layout of the transfer gate portion, thus realizing a CCD of higher density pixels. For example, it is possible to realize a CCD of multi-line read and two-layer poly silicon structure in which the pitch of the CCD register portion is 11 μm in 2.5 μm rule, so that it is possible to realize a linear image sensing device of 5.5 μm pitch.

Further, when the second-group charges e21 and e22 are being transferred to the second RC region 105, the first-group charges e1 are kept remaining at the GR region 110, so that it is possible to prevent the first-group charges e1 from being mixed with the second-group charges e21 and e22 at the first RC region 104.

Further, in the above-mentioned first embodiment, the second-group charges are divided into two sets of charges e21 and e22 and transferred twice to the second RC region 105 by the transfer gate portion. Without being limited thereto, it is possible to prevent the mixture of charges between the pixels by dividing the transfer operation of the second-group charges into three times or more by the presence of the GR (accumulation gate register) region 110. In this case, two sets of the charges are transferred at a time from the GR region 110 to the first RC region 104, while keeping another set of remaining charges at the GR region 110. Therefore, it is also possible to transfer charges for each 6 to 8 pixels, as far as a sufficient long transfer time is allowed.

Figure 12:
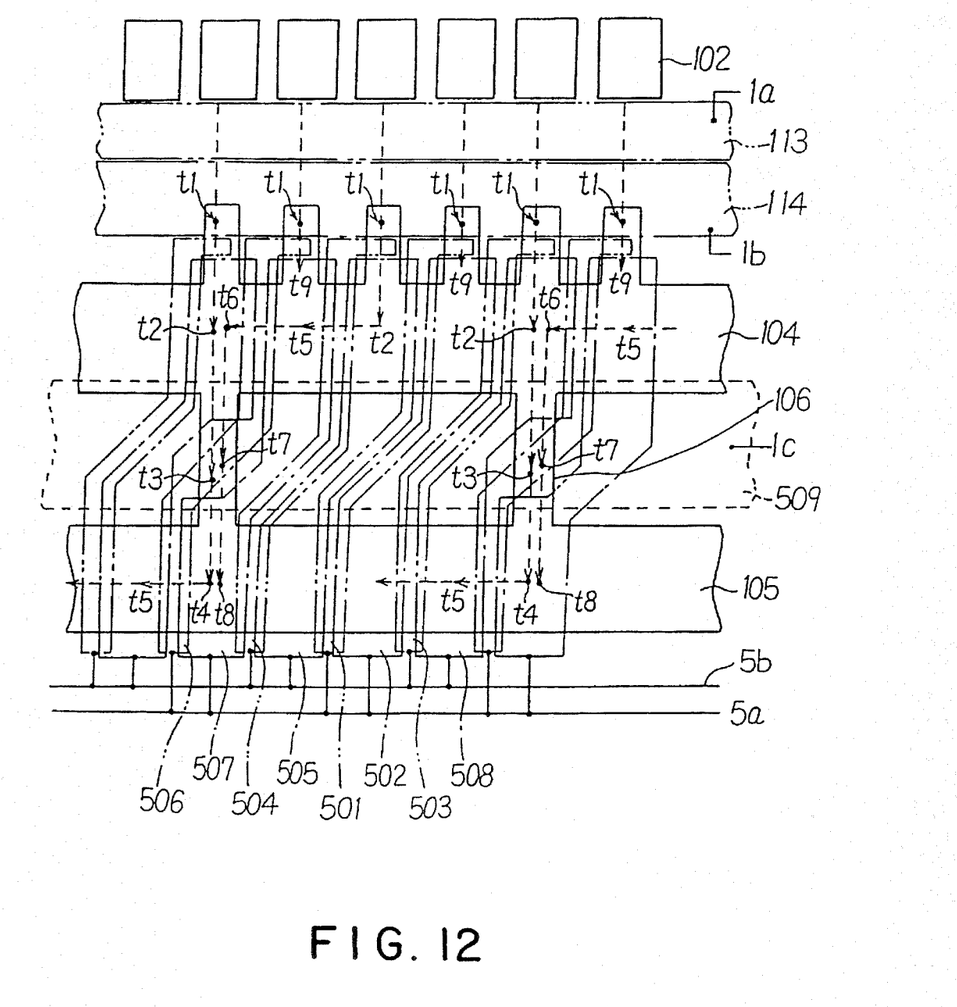
FIG. 12 is a plan view showing a second embodiment of the charge transfer device according to the present invention.

FIG. 12 shows a second embodiment of the charge transfer device of the present invention, in which the two-line read three-layer structure is shown. The same reference numerals have been retained for the similar elements or parts which have the same functions as with the case of the first embodiment shown in FIG. 8. In FIG. 12, the first layer electrodes are shown by dot-dashed lines; the second layer electrodes are shown by dot-dot-dashed lines; and the third layer electrodes are shown by dashed lines, respectively.

In FIG. 12, electrodes 501 and 508 for constituting the CCD register portion and an electrode 509 for constituting the transfer gate portion are formed in the substrate. As shown in FIG. 12, the electrodes 502, 505, 507 and 508 are formed on the first layer; the electrodes 501, 503, 504 and 506 are formed on the second layer; and the electrode 509 is formed on the third layer, respectively. The electrode 509 for constituting the transfer gate portion is arranged separately on the third layer in such a way as to extend all over the TC region 106 formed in the substrate in continuous band shape.

In FIG. 12, two drive pulse signals 5a and 5b are also shown to control the transfer operation of the charges on the first and second RC regions 104 and 105. The drive pulse signal 5a is applied to the electrodes 501, 502, 506 and 507; and the drive pulse signal 5b is applied to the electrodes 503, 505 and 508, respectively.

In the case of the first embodiment shown in FIG. 8, the shapes of the electrodes 115 to 122 are such that both ends of the electrodes 115 to 122 are located on the same longitudinal positions of the first and second RC regions 104 and 105, so that the charges on the first and second RC regions 104 and 105 are transferred therealong in juxtapositional relationship with respect to one another.

Figures 13A, 13B:
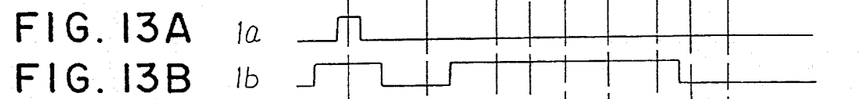
FIGS. 13A to 13E are timing charts of drive pulse signals applied to the electrodes of the second embodiment o the charge transfer device shown in FIG. 12.
Figures 13C, 13D, 13E:
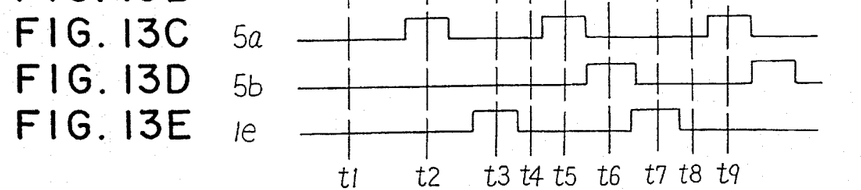

In contrast with this, in the second embodiment shown in FIG. 12, the shapes of the electrodes 501 to 508 are such that one ends thereof located on the first RC region 104 are offset from the other ends thereof located on the second RC region 105, so that the charges on the second RC region 105 are transferred being advanced one pitch of the pixels 102 with respect to the charges transferred on the first RC region 104 in synchronism with one another. Accordingly, the drive pulse signals 5a and 5b are determined as shown in FIGS. 13C and 13D, respectively. In comparison with the drive pulse signals 1c and 1d shown in FIGS. 10C and 10D, the drive pulse signals 5a and 5b are the same as the drive pulse signals 1c and 1d till time t4 (until the second-group first-set charges e21 are transferred to the second RC region 105). However, after time t5, in the second embodiment, the second-group, first-set charges e21 are transferred on and along the second RC region 105 by turning on and off the drive pulse signals 5a and 5b alternately and reciprocally in opposition to the pulse signals 1c and 1d.

The operation of the second embodiment other than the above is substantially the same as with the case of the first embodiment. Therefore, in this second embodiment, it is also possible to relax the restriction on the channel width of the TC region 106 of the transfer gate portion. Further, as well understood in comparison with the conventional charge transfer device as shown in FIG. 7, it is possible to obtain a space margin with respect to the element layout of the transfer gate portion, thus realizing a CCD of higher density pixels.

As described above, in the charge transfer device according to the present invention, since the transfer operation of all the second-group charges to be transferred between the two transfer paths by the transfer gate portion is divided into a plurality of times, it is possible to reduce the number of transfer gates by the number of divisions, thus relaxing the restriction on the channel width of the transfer gate portion. Consequently, it is possible to eliminate the potential barrier due to the narrow channel effect, thus preventing charges from being kept remaining during the charge transfer operation between the first and second transfer paths.

Further, it is possible to obtain a sufficient margin with respect to the layout of the transfer gate portion, so that the CCD of higher pixel density can be realized. For example, it is possible to realize a CCD of multi-line read and two-layer poly silicon structure in which the pitch of the CCD register portion is 11 μm in 2.5 μm rule, so that it is possible to realize a linear image sensing device of 5.5 μm pitch.

Further, since the charge keeping portion is formed, it is possible to prevent the charges of two adjacent pixels from being mixed with one another, by keeping some charges at the charge keeping portion when the other remaining charges are being transferred from the first transfer path to the second transfer path. Therefore, it is possible to freely determine the number of charge transfer gates of the transfer gate portion. In this case, when two sets of the charges are transferred at a time from the charge keeping portion to the first transfer path, while keeping another set of remaining charges at the charge keeping portion, it is possible to prevent the charges of different pixels from being mixed with one another on the first transfer path. In other words, it is possible to obtain a sufficient margin with respect to the layout of the transfer gate portion, thus realizing a CCD of higher density pixels and higher reliability.

What is claimed is:

1. A charge transfer device, comprising:

a shift gate portion for outputting, in parallel, charges of pixels of a first group and charges of a predetermined number of pixels of a second group arranged in a line, every outputted pixel charge of the second group being interposed between two outputted pixel charges of the first group;

a first charge transfer path provided in parallel to the shift gate portion, to which the outputted charges of the first-group and second-group pixels are separately supplied and through which the supplied charges of the first-group and second-group pixels are separately transferred;

a second charge transfer path provided in parallel to the first charge transfer path, through which the charges of the second-group pixels are transferred;

a transfer gate portion provided between the first and second charge transfer paths and having a predetermined number of gate electrodes by which the charges of the second-group pixels are transferred from the first charge transfer path to the second charge transfer path, the number of the gate electrodes being less than the number of the second-group pixels; and control means for controlling transfer of charges of at least two pixels are the second-group pixels such that the two charges are separately transferred from the first charge transfer path to the second charge transfer path by one of the gate electrodes at different times.

2. The charge transfer device of claim 1, which further comprises charge keeping means, interposed between the shift gate portion and said first charge transfer path, for selectively keeping charges of the first-group pixels while charges of the second-group pixels are transferred to said first charge transfer path.

3. The charge transfer device of claim 2, wherein said control means comprises:

second-group transfer control electrodes arranged over the first and second transfer paths and responsive to a first control signal, the second-group charges being transferred from said charge keeping means to said first charge transfer path;

first transfer control electrodes arranged over the first and second transfer paths and responsive to a second control signal generated after the first control signal, charges of a half of the pixels for generating the second-group charges being transferred from said first charge transfer path to said second charge transfer path;

second transfer control electrodes, arranged over the first and second transfer paths and responsive to a third control signal generated after the second control signal, charges of the remaining half of the pixels for generating the second-group charges being transferred from said first charge transfer path to said second charge transfer path; and first-group transfer control electrodes arranged over the first and second transfer paths and responsive to a fourth control signal generated after the third control signal, the first-group charges being transferred from said charge keeping means to said first charge transfer path.

4. The charge transfer device of claim 1, wherein said transfer control electrodes are formed in a two layer structure on a semiconductor substrate in which the pixels, said first charge transfer path, said second charge transfer path, and said transfer gate portion are formed.

5. The charge transfer device of claim 1, wherein said transfer control electrodes are formed in a three layer structure on a semiconductor substrate in which the pixels, said first charge transfer path, said second charge transfer path, and said transfer gate portion are formed.

* * * * *